United States Patent [19]

Heavey et al.

[11] Patent Number: 4,468,571

[45] Date of Patent: Aug. 28, 1984

[54] STANDBY POWER SYSTEM

[75] Inventors: Frederick D. Heavey, St. Paul; Mark R. Kaldun, Eagan, both of Minn.

[73] Assignee: SAFT America, Inc., Valdosta, Ga.

[21] Appl. No.: 436,990

[22] Filed: Oct. 27, 1982

[51] Int. Cl.³ .............................................. H02J 7/00
[52] U.S. Cl. ....................................... 307/66; 307/46
[58] Field of Search ...................... 307/46, 48, 65, 66, 307/87, 130, 234; 328/26, 28, 185, 187; 340/363, 636, 693

[56] References Cited

U.S. PATENT DOCUMENTS 3,925,772 12/1975 Miller et al. ........................... 307/66
4,160,922 7/1979 Rickenbacker .................... 328/26 X Primary Examiner—E. A. Goldberg
Assistant Examiner—D. Jennings
Attorney, Agent, or Firm—Wallenstein, Wagner, Hattis, Strampel & Aubel

[57] ABSTRACT

A standby AC electrical power system connected between a load device and the AC line voltage comprises a voltage responsive control circuit connected between the AC line voltage source and a DC to AC inverter circuit. The control circuit generates a continuously pulsating DC control voltage which has an envelope which responds to and follows but at a different rate the increase and decrease in the envelope of the output of a full wave rectifier fed by the AC line voltage. The control voltage remains above a given triggering level when the average value of the rectified output for the current half cycle involved stays above a given monitored level indicating that the average value of the current half cycle of the AC line voltage is above a given low level and drops to the triggering level when the average value of the current half cycle of the AC line voltage drops to the given low level. The circuit which generates this control voltage comprises a multi-branched capacitor charge and discharge circuit having a first relatively long time constant producing branch which provides a relatively slowly increasing envelope in response to the rise in the envelope of the rectified output of a relatively short time constant producing branch which provides a relatively rapidly decreasing envelope in response to the drop in the envelope of the rectified output. A trigger circuit responds to the dropping of the envelope of the control voltage to the triggering level by connecting a DC battery to the DC to AC inverter circuit which then supplies an AC voltage to the load device.

11 Claims, 8 Drawing Figures

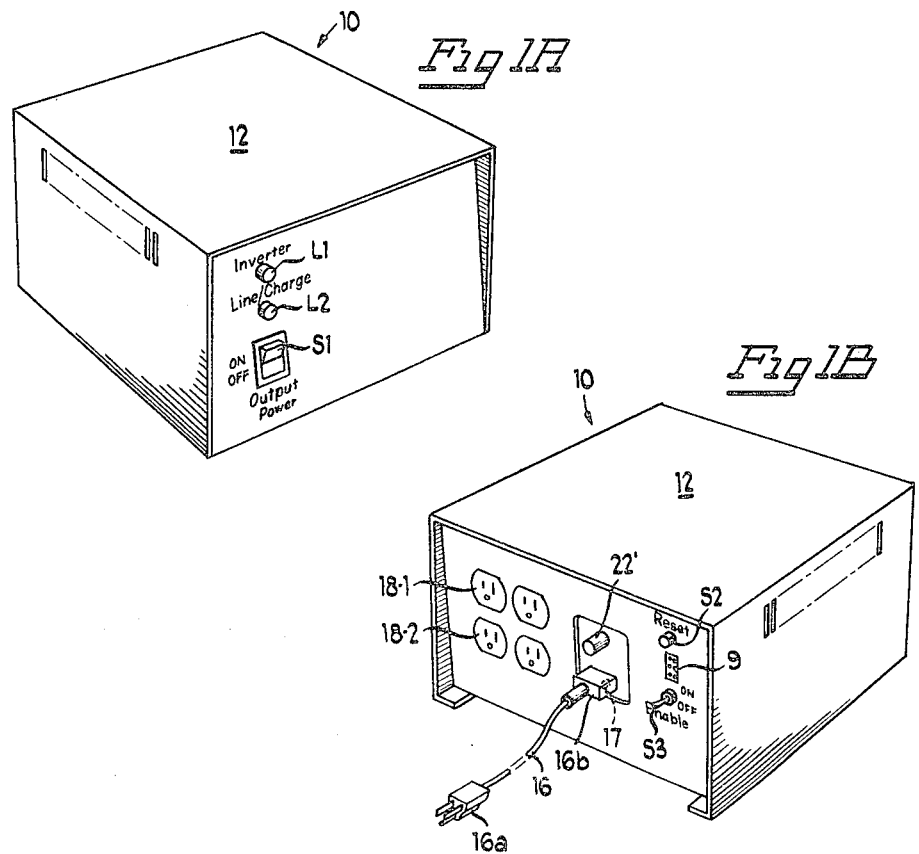

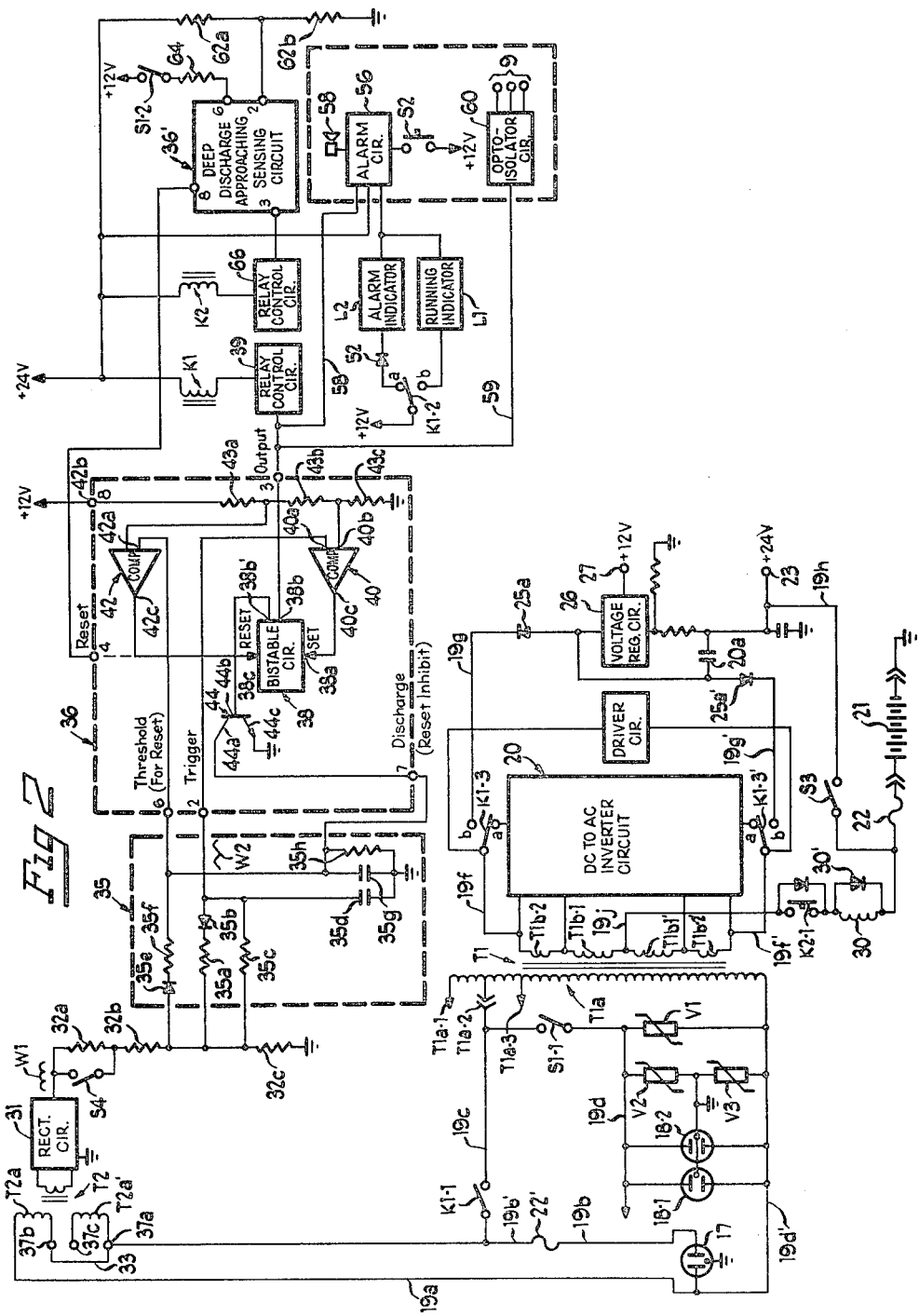

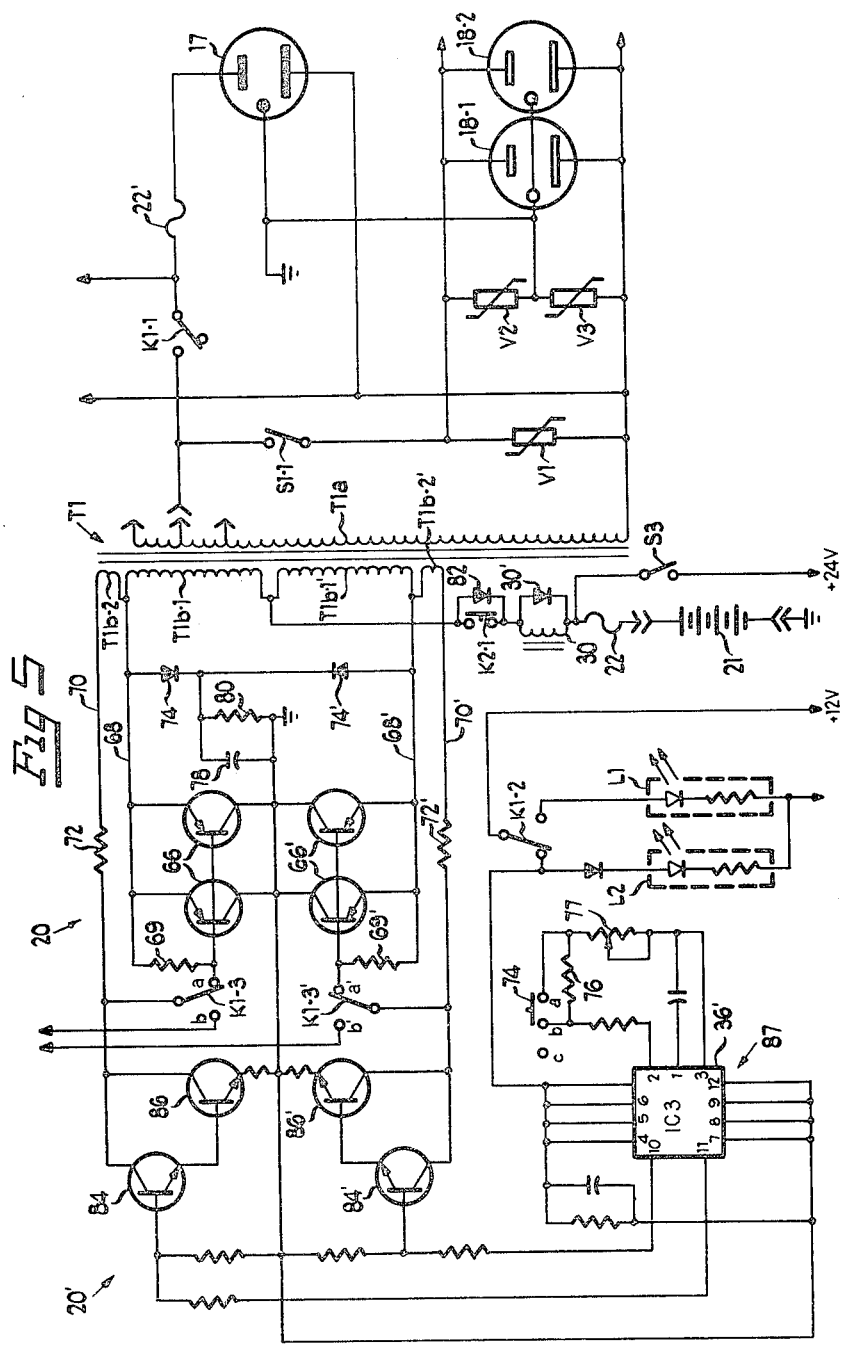

ND BY POWER SYSTEM

TECHNICAL FIELD OF INVENTION

This invention relates to standby power systems, namely power systems interposed between the AC power line and an electrical device, like a computer which has volatile storage for data which can be lost by a power failure, or an alarm device which should be operable upon power failure, and utilize the voltage of a DC battery to generate an AC voltage which keeps the device involved operating properly. More specifically, the type of standby power system to which the present invention relates is one wherein the magnitude of the AC line voltage is monitored by the standby power system and when this voltage disappears or drops below a given low level the system automatically connects the DC battery, which is kept charged during normal "standby" operation, to a DC to AC inverter circuit which generates an AC voltage which operates the electrical device in the normal manner.

PRIOR ART

Standby power systems as above described have been available for many years. Generally, they have been satisfactory for most of their intended purposes. However, these prior standby power systems left much to be desired from the standpoint of the speed within which they reacted to the dropping of the line voltage below a given level and the substantial cost to manufacture the same.

Particularly in the case of standby power systems used for computer applications, many computer systems can lose the data stored therein even if the AC line voltage disappears for as little as half a cycle. The present invention provides a standby power system which can be manufactured to sell at a substantially lower cost than inferior standby systems heretofore available, and responds in less than one-half cycle of a 60 cycle AC line voltage to a dropping of the average value of a half cycle of the line voltage below a predetermined low level.

SUMMARY OF THE INVENTION

While the invention is not so limited, the commercial form of the present invention uniquely makes use of a relatively inexpensive, readily available integrated circuit chip identified in the industry as the Signetic 555 timer chip. This timer chip is provided with a number of terminals which can be connected in various ways to form monostable bistable, oscillating and time delay circuits. However, to our knowledge, the Signetics 555 integrated circuit chip has never been utilized as a trigger circuit in the manner of the present invention. In a manner to be explained, a unique capacitor charge and discharge trigger circuit setting circuit is interposed between the output of a full wave rectifier circuit, which is fed by the input of the AC power line voltage involved, and at least a "trigger" terminal of the Signetics 555 timer chip. This capacitor charge and discharge setting circuit provides a voltage at this "trigger" terminal which drops below a triggering level of the circuit when the average value of the current half cycle of the AC line voltage drops below said given low level. When the voltage on the trigger terminal of this chip drops below this triggering level, a trigger circuit formed by the chip is set to generate an output control voltage utilized to operate a control device, such as a relay, which then connects the chargeable DC battery to a DC to AC inverter circuit which supplies the AC voltage necessary to normally operate the load device involved. The power system is then operating in what will be referred to as the "inverter mode".

The capacitor charge and discharge setting circuit described most advantageously is a multi-branched circuit having a first relatively long time constant producing branch in series with a capacitor connected to the "trigger" terminal referred to and which provides a relatively slowly increasing envelope in the voltage waveform appearing across the capacitor in response to the rise in the envelope of the full wave rectified output, and a relatively short time constant producing branch circuit which produces a relatively rapidly decreasing envelope in the voltage waveform appearing across the capacitor in response to the drop in the envelope of the rectified output. The circuit produces across the capacitor connected to the trigger terminal of the timer chip described a modified pulsating DC voltage which has an envelope which responds to and follows, but at a different rate, the increase and decrease in the envelope of the rectified pulsating DC output of the full wave rectifier circuit. The envelope of the voltage produced across this capacitor remains above the triggering level of the timer chip generally when the average value of the current half cycle waveform of the rectified pulsating DC output stays above a given monitoring level. The envelope of the voltage across this capacitor drops below this triggering level when the average value of the current half cycle of the DC line voltage drops to said given low level. Because of this unique multi-branch circuit described, the circuit responds extremely quickly to the dropping of the AC line voltage below said level.

In the most preferred form of the invention, the "threshold" terminal of the Signetics 555 timer chip is also utilized in a unique manner. To this end, an automatic resetting circuit is provided which returns the power system automatically to the normal "standby mode". The reset branch circuit comprises resistance, rectifier and capacitor elements interposed between the output of the full wave rectifier circuit referred to and the "threshold" and "discharge" terminals of this timer chip. One end of the capacitor is connected to the "threshold" and "discharge" terminals and the other thereof is connected to ground or other reference point. In the normal or reset state of the trigger circuit formed by the timer chip the voltage on the "discharge" terminal is at ground potential which inhibits the charge of the capacitor in this reset circuit. When the trigger circuit is in its set state to effect the "inverter mode" of operation of the standby power system, ground potential is removed from the "discharge" terminal, permitting the capacitor in the resetting circuit to charge to a value proportional to the average DC value of the full wave rectified input voltage waveform applied to the input of this circuit. When the voltage on this "threshold" terminal exceeds a given reset initiating level, the trigger circuit is reset to return the power system to the "standby mode" of operation. The time constant of this circuit is adjusted so that it takes a substantial amount of time, before the voltage on the capacitor reaches a level which will effect a resetting of the trigger circuit. The trigger circuit thus becomes automatically reset when the AC line voltage returns to a normal desired level for a predetermined minimum period, such as 3 seconds in the example of the invention being described, indicating generally that the AC line voltage has stabilized at a normal level.

The broader aspects of the invention as above indicated involve the use of the trigger circuit setting circuits with or without an automatic reset circuit as described, and without necessarily using the Signetic timer chip as the trigger circuit, although the cost of the standby power system is substantially reduced by using this or any similar chip. Also, a specific feature of the invention involves the use of a trigger circuit including bistable and comparator circuits to be described.

The just described and other features and advantages of the invention will become apparent upon making reference to the specification to follow, the claims and the drawings.

DESCRIPTION OF DRAWINGS

FIG. 1A is a front perspective view of a standby power system unit which incorporates the features of the present invention;

FIG. 1B is a rear perspective view of the standby power system unit of FIG. 1A which incorporates features of the present invention;

FIG. 2 is a detailed, partially block and partically circuit diagram of the circuitry forming the standby power system of the most preferred form of the invention which is incorporated in the unit shown in FIGS. 1A and 1B;

FIG. 3 is a chart illustrating various voltage and circuit conditions present in various parts of the circuitry shown in FIG. 2 for the "standby" and "inverter" operating modes of the invention;

FIG. 5 shows exemplary circuitry for the DC to AC inverter circuit, and the alarm and warning indicator circuits shown in FIG. 2 in block form.

DESCRIPTION OF EXEMPLARY FORM OF THE INVENTION SHOWN IN THE DRAWINGS

Figure 4A:
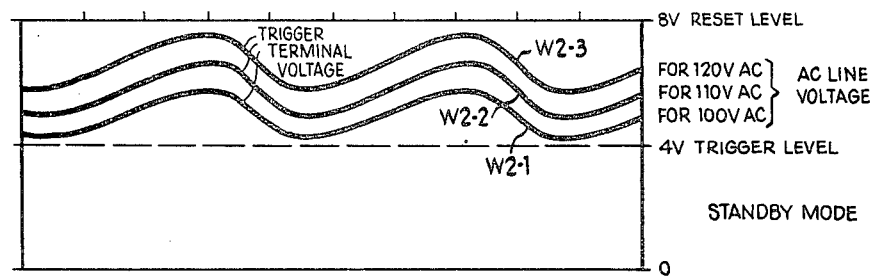
FIG. 4A shows the voltage waveforms applied to the "trigger" terminal of the trigger circuit portion of FIG. 2 for various AC line input voltages indicated thereon.

While the standby power system of the invention can be packaged in a number of different ways, it is most advantageously packaged in a single housing 12 shown in FIGS. 1A and 1B. FIG. 1A shows a pair of light units L1 and L2 on the front wall of the housing respectively identified as "Inverter" and "Line/Charge" light units. A two-position toggle switch S1 identified as an "Output Power" switch S1 is also mounted on the front wall of the housing 12. When the toggle switch S1 is depressed to an "ON" position along with an "Enable" toggle switch S3 on the rear wall of the housing 12 (FIG. 1B), rated 110 volt AC voltage will generally be accessible at the load device input terminals which, in the commercial form of the invention, are grounded sockets 18-1, 18-2, etc. on the rear wall of the housing 12. A power cord (not shown) extending from the particular device being energized is plugged into one of the selected sockets 18-1, 18-2, etc. to energize that device. The standby power system unit 10 is energized through a power cord 16 having a conventional plug 16a on the outer end thereof pluggable into a standard AC commercial socket, and a plug 16b on the inner end thereof pluggable into a socket 17 exposed on the rear wall of the housing 12. When the "Output Power" and "Enable" switches S1 and S3 are in their "ON" positions, rated AC voltage originates from the power cord 16 if the power cord 16 is plugged into an active power line connected wall socket having a rated line voltage. If it is not so plugged, or the line voltage drops below a monitored level this rated AC voltage is supplied through a DC to AC inverter circuit shown by reference numeral 20 in block form in FIG. 2, energized from a chargeable 24 volt battery 21 in the housing 12, as long as the DC battery 21 has not reached a near deep charge condition where the power system unit operates to disconnect the battery from the inverter to avoid a battery-damaging deep "discharge" condition.

When the power cord 16 is plugged into a wall socket supplying at least the desired minimum voltage, the unit 10 is in a "standby mode" where the DC battery 21 is disconnected from the DC to AC inverter circuit 20, and a charge circuit to be described keeps the DC battery 21 substantially fully charged. The "Line/Charge" light unit L2 which may emit an amber colored light, is then energized.

The unit 10 responds to average voltages measured over only a half cycle of the AC line voltage. Thus, if a half cycle of the AC line voltage should disappear or the average value thereof over a given half cycle should fall below a given low level, the "Inverter" light unit L1 will become energized and emit a preferably red colored light. If an alarm option is included in the standby power system unit 10, this red light will be a flashing indication which may be changed to a steady red indication by depressing of a "Reset" pushbutton S2 on the back wall of the housing 12. Also, when the alarm option is used, an audible alarm is given by a buzzer in the housing 12 to alert the operator that the line voltage has dropped below the monitored level and the unit is being operated in its "inverter mode" and the amber light unit L2 is de-energized. When the unit 10 is in its "Inverter mode" a signal indicating this fact is available at an output terminal 9 on the rear of the housing 12. A suitable plug-in conductor (not shown) may be plugged into this terminal and into an input of a computer system or the like which can indicate on the display screen thereof the fact that the device is being operated under battery power. Since the charge on the battery 21 can be depleted within a limited time period, such as 20 minutes, it is important that the operator use this time period to some useful end. For example, if a computer is plugged into one of the sockets 18-1, it is important that within that 20 minute period the operator transfer any data stored in a temporary volatile storage to permanent storage to avoid loss of the data involved.

The primary uniqueness of the present invention lies in the circuitry contained within the unit 10, which greatly reduces the cost of manufacture thereof over competing standby power systems and enables the unit 10 to act extremely quickly, such as within one-half cycles of a 60 cycle power line voltage, to a decrease in the line voltage below the monitored level.

For an understanding of the unique features of the present invention, reference should now be made to FIG. 2, which is a diagram of the circuitry within the unit 10. It should be understood that the circuitry there-shown is, for the most part, a preferred circuit, and numerous modifications may be made therein without deviating from the broader aspects of the invention. As illustrated in FIG. 2, the power input socket 17 is shown having one of its terminals connected by a conductor 19b to a fuse 22', in turn, connected to a conductor 19b' extending to one terminal of a primary winding of a power transformer T2, whose secondary winding is connected to a full wave rectifier circuit 31. The normally-open contacts K1-1 of a relay K1 energized during "standby" operation of the unit 10 is connected between the conductor 19b' and a conductor 19c extending to a selected 125, 117 or 100 volt tap T1a-1, T1a-2, or T1a-3 of the winding T1a of a transformer T1, the connection in the figure being shown to the 117 volt tap T1a-2. Contacts S1-1 of the "Output Power" switch S1 are shown connected between the conductor 19c and a bus 19d leading to one of the terminals of each of the load device sockets 18-1, 18-2, etc. The opposite terminals of these load device sockets are connected to a bus 19d' extending from the other terminal of the input power socket 17 to the opposite end of the winding T1a, and also to a conductor 19a connecting with the other terminal of the power input socket and the other terminal of the primary winding of transformer T2.

Since the relay K1 is energized during the "standby mode" of operation of the unit 10, it is apparent that the AC voltage appearing on the terminals of the power input socket 17 will be fed through the contacts K1-1 and S1-1 to the bus 19d to energize the terminals of the load device connecting sockets 18-1, 18-2, etc. Connected between the bus 19d and the bus 19d' is a varistor V1 in parallel with a pair of series connected varistors V2 and V3, the point of intersection of which is connected to the ground terminals of the sockets 18-1, 18-2, etc. to provide transient voltage protection especially in the "standby mode" of operation of the unit 10.

When the power input socket 17 is disconnected from the AC power line involved, or the power line voltage otherwise disappears or drops below a given desired monitored value, the load device connecting sockets 18-1, 18-2, etc. receive their voltage from the output transformer T1 of the DC to AC inverter circuit 20.

The transformer T1 has a series of connected secondary windings T1b-2, T1b-1, T1b-1', and T1b-2' which form part of the inverter circuit 20. The circuit 20 when energized generates an AC voltage across these various windings which voltage is induced into the winding T1a during the "Inverter Mode" of operation of the unit 10. During the "standby mode" of operation of the unit 20 the AC voltage delivered to the transformer winding T1a from the power input socket 17 will generate a voltage across the various T1b windings described. This voltage is coupled by conductors 19f–19f' through the movable pole K1-3 and K1-3' of relay, the "A" stationary contact thereof, and conductors 19g–19g' to the cathodes of battery charger rectifiers 25a–25a'. The anodes of these rectifiers are connected to a common point, in turn, connected to a capacitor 20a associated resistors and a voltage regulator circuit 26 to be later described.

The battery 21 receives its charging voltage through a circuit which includes a fuse 22 connected to the positive terminal of the battery 21, contacts S3-1 of the "Enable" switch S3 which are closed when the switch is in its "ON" position, and a conductor 19h extending to a positive 24 volt terminal 23 and also to a circuit including a grounded capacitor 20a which connect the battery 21 to the rectified output of the transformer T1 to charge the battery 21. The battery 21 at all times energizes the voltage non-critical circuits to be described, and also energizes the voltage regulator circuit 26 which in turn provides a regulated +12 volts on the output terminal 27 thereof. This closely controlled voltage must be precisely regulated in order to properly operate the circuitry which is connected to the output of the rectifier circuit 31 soon to be described.

The battery 21 is connected to operate the DC to AC inverter circuit 20 by a path including a flyback inductor 30 shunted by transversely connected rectifier 30', the normally-open contacts K2-1 of a battery voltage monitoring relay K2 which is normally energized during the time that the battery remains in a safely charged state, and a conductor 19j extending to the juncture of winding sections T1b-1 and T1b-1'.

As shown in FIG. 2, the transformer T2 is provided with a pair of primary windings T2a and T2a'. For AC power lines having a normal voltage 117 volts (RMS), one end of the winding T2a is connected to the power conductor 19a. The other end of this winding is connected to a jumper terminal 37b connected by a jumper 33 to a jumper terminal 37a to which the conductor 19b' extends. For European use where line voltages are commonly 240 volts or the like, the primary windings T2a and T2a' are connected in series by a suitable jumper connected between the jumper terminal 37b and a jumper terminal 37c to which one end of the primary winding T2a' is connected. The other end of the primary winding T2a' is connected to the jumper terminal 37a as indicated. The connections to the transformer T2 in the commercial form of the invention provide a 10 to 1 stepdown ratio.

The full wave rectified output of the rectifier circuit 31 fed by the secondary winding of transformer T2 is connected to a voltage divider circuit comprising resistors 32a, 32b and 32c connected in series to ground. When the unit 10 is used in an area that has an unusually low voltage, a switch S4 shunting the resistor 32a can be closed to increase the voltage fed to the portion of the circuit now to be described.

The juncture of the resistors 32b and 32c is connected to a multi-branched DC voltage responsive circuit generally indicated by reference numeral 35. This multi-branched circuit has a trigger circuit setting section to be described which, from the full wave rectified waveform W1 fed to this section of the circuit, provides a modified pulsating DC voltage waveform W2 which follows, but at a different rate, the increase and decrease in the envelope of the rectified pulsating DC waveform W1, while remaining above a given triggering level identified in FIG. 4A, which is shown there as a level of plus 4 volts, when the average value of the rectified pulsating DC waveform W1 for the current half cycle involved stays above a given level indicating that the average value of the current half cylce of the AC line voltage is above a desired monitored level. The envelope of this modified pulsating DC voltage generated by the circuit 35 drops below this triggering level when the average value of the current half cycle of the AC line voltage drops to the monitored level. It should be noted that one of the important aspects of the invention is that for each half cycle of the AC line voltage the envelope of the modified pulsating DC voltage waveform W2 has a relatively slowly increasing envelope section and a very rapidly decreasing envelope section, the latter section being responsible for the fast operation of the standby power system as previously explained.

The trigger circuit setting section of the voltage responsive circuit 35 has a first branch connected to the juncture of resistors 32b and 32c and including a relatively large resistor 35c and a second branch in parallel therewith including a relatively small resistor 35a and a rectifier 35b. These two branches are connected in series with a grounded capacitor 35d. The juncture of the capacitor 35d and the branches just described are connected to the No. 2 "trigger" terminal of the trigger circuit 36 most advantageously formed by the aforementioned Signetics 555 timer chip. The rectifier 35b is connected so that this rectifier will conduct when the voltage charge on the ungrounded terminal of the capacitor 35d is higher than the instantaneous value of the voltage at the juncture of resistors 32b and 32c. It can be seen that, initially, the capacitor 35d will charge through the branch including the relatively large resistor 35c as the full wave rectified pulsating DC waveform W1 is increasing. The rectifier 35b on the other hand will begin to conduct during a portion of the envelope of the waveform W1 when it is decreasing towards zero. The resistance value of the resistor 35a is several times smaller than the resistor 35c so that the capacitor discharge circuit time constant of the branch including the resistor 35a is much smaller than the time constant of the capacitor charging circuit including the resistor 35c.

When the pulsating DC output waveform W2 drops to the triggering level, a trigger circuit 36 is operated to energize the relay K1, which effects the connection of the battery 21 to the AC to DC inverter circuit 20 as previously explained.

The voltage responsive circuit 35 also has a resetting section which resets the trigger circuit 36 to return the unit 10 to its "standby mode" of operation when the AC line voltage returns to a more normal level after a given delay, such as 3 seconds, so that the unit 10 is not returned to its "standby" operation until the AC line voltage appears to have stablized.

Figure 4B:
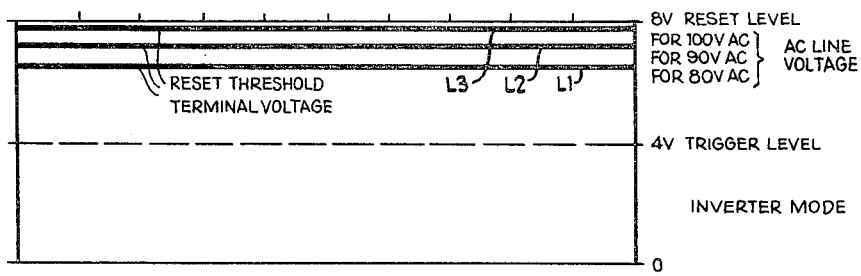
FIG. 4B shows the DC voltage appearing at the "threshold" terminal of the trigger circuit portion of FIG. 2 for the various AC line input voltages indicated thereon.

In the commercial form of the invention, the values of the resistors 35a and 35c and the capacitor 35d are as follows:

Resistor 35a—56,000 Ohms
Resistor 35c—150,000 Ohms
Capacitor 35d—0.1 Microfarads FIG. 4B shows three waveforms W2-1, W2-2 and W2-3 of the voltage charge across the capacitor 35d when the AC line voltage has RMS values respectively of 120 volts, 110 volts, and 100 volts. It can be seen that for the 100 AC line voltage, the waveform W2-1 dips to a point immediately above the trigger level of +4 volts, so that any decrease in the AC line voltage from this 100 volt level will cause the trigger circuit 36 to be triggered into a set condition providing a "monitored mode" of operation of the power system unit 10.

The trigger circuit resetting branch of the voltage responsive circuit 35 is shown as including a rectifier 35e, whose anode is connected to the juncture between resistor 32b and resistor 32c and a resistor 35f. The resistor 35f is connected in series with a grounded capacitor 35g shunted by a resistor 35h. The juncture between capacitor 35g and the resistor 35e is connected to the No. 6 "Threshold" terminal of the trigger circuit 36. The time constant for the circuit in which the capacitor 35g is located is very great, so as to produce a voltage on the ungrounded terminal of the capacitor 35g which is more or less a steady DC voltage which varies with the average values of the AC line voltage over a large number of cycles of the AC line voltage.

The value of the reset circuit elements can be as follows:

Resistor 35f—100,000 ohms
Resistor 35f—562,000 ohms
Capacitor 35g—10 microfarads When the trigger circuit 36 is in its normal reset state, which effects a "standby mode" of operation of the unit 10, a No. 7 "Discharge" terminal of the trigger circuit 36 will be at ground potential, thereby preventing the capacitor 35g from charging to a trigger circuit resetting level, which is assumed to be +8 volts in the exemplary form of the invention being described. When voltage on the capacitor 35g reaches +8 volts, the trigger circuit 36 will be reset, which can occur only when the trigger circuit 36 is in a set state since otherwise the trigger circuit could not be reset by AC voltages below the monitored level. The most desired circuit has a hysteresis which desirably is reset by an AC line volt higher than that which set the trigger circuit. The No. 7 terminal of the trigger circuit 36 is in effect a reset inhibit terminal which prevents the voltage of capacitor 35g from rising to a value which would prevent the setting of the trigger circuit 36 when the trigger circuit is in its reset state. When the trigger circuit 36 is in a set state, the voltage on the No. 7 "discharge" terminal disappears.

FIG. 4B shows the voltage charge levels L1, L2 and L3 on the ungrounded terminal of the capacitor 35g when the trigger circuit 36 is in its set state for three exemplary AC line voltages respectively of 80, 90, and 100 volts. It can be seen that the DC voltage on the capacitor 35g reaches the reset level for an AC line voltage slightly above the AC line voltage which produce the uppermost DC voltage level L3 shown in FIG. 4B.

The circuitry for the Signetics 555 timer chip 36 shown in FIG. 2 includes a bistable circuit 38 (FIG. 2) having a set input terminal 38a, a pair of output terminals 38b and 38b' and a reset terminal 38c. The output terminal 38b is connected to the No. 3 "Output" terminal 3 of the trigger circuit 36. The "Output" terminal 38b' of the bistable circuit 38 is connected to the base 44b of a NPN transistor 44 whose emitter is grounded and whose collector is connected to the No. 7 "discharge" terminal of the trigger circuit 36.

When the bistable circuit is reset, the output terminal 38b is at ground potential. The voltage at the output terminal 38b is at a relatively high positive potential which causes the transistor 44 to be conductive, thereby applying ground to the No. 7 terminal of the trigger circuit 36. The No. 3 terminal of the trigger circuit 36 is connected to a suitable relay control circuit 39 which may be a transisterized circuit or the like which controls a relay K1, the coil of which is shown extending to the 24 volt terminal 23. When ground potential appears at the "Output" terminal of the trigger circuit 36, the relay control circuit 39 connects one end of the relay coil K1 to ground, thereby energizing the relay during the "standby mode" of operation of the power system unit 10 being described.

The trigger circuit 36 has a voltage divider network comprising resistors 43a, 43b, and 43c connected between the No. 8 terminal of the trigger circuit 36 and ground. The No. 8 terminal is connected to the +12 volt, bus or terminal 27, the voltage of which is stabilized by the previously described voltage regulator circuit 26. FIG. 2 shows a connection between the +12 volt terminal 23 and a No. 4 "Reset" terminal of the trigger circuit 36. For the purposes of the present description it is unnecessary to show the internal connections of this reset terminal which is provided by the Synetics 555 chip. The circuit shown in FIG. 2 is otherwise operable for the various connections shown therein.

The resistors 43a, 43b and 43c are of equal value and thus the point of connection of resistors 43a and 43b is a +8 volts and the point of the connection of resistors 43b and 43c are at a regulated voltage +4 volts. These connecting +4 and +8 voltage points are respectively connected to the input terminals 42b and 40b of comparator circuits 42 and 40 respectively. The comparator circuit 42 has a second input terminal 40a extending to the No. 6 "Threshold" terminal of the trigger circuit 36, and the comparator circuit 40 has an input terminal 40a extending to the No. 2 "Trigger" terminal of the trigger circuit 36. The comparator circuit 40 will generate a set signal fed to the set input terminal 38a of the bistable circuit 38 when the voltage on the "Trigger" terminal of the trigger circuit 36 drops to or below +4 volts. The comparator circuit 42 has an output terminal 42c connected to the reset input terminal 38c of the bistable circuit 38 to reset the same when a voltage on the input terminal 42a thereof reaches or exceeds 8 volts.

When the trigger circuit 36 is in a reset state so the standby power system unit 10 is in its "standby mode" of operation, as previously indicated, the relay K1 is in an energized condition. The relay has a movable pole K1-2 connected to the +12 volt terminal 23 and which engages a "b" stationary contact connected to the "Line/Charge" light unit L1 to energize the same. When the trigger circuit 36 is operated to its set state to effect an "inverter mode" of operation of the unit 10, the relay K1 becomes de-energized as a positive voltage is fed to the input of the relay control circuit 39. The movable pole of the contacts K1-2 then moves to an "a" stationary contact connected to a rectifier 52, in turn, connected to the "inverter" indicator light unit L2, the result being a red light indication in the exemplary form of the invention to be described. This indication can be a steady indication or a flashing indication depending upon the selection of the user. If output of the alarm indicator is grounded, the light indication will be a steady indication. However, as shown, the alarm light L2 is connected to an alarm circuit 56 which includes a flasher circuit (not shown) which will effect a flashing red light indication on the light unit L2. This alarm circuit 56 can also operate an audible alarm 58 to alert the operator of the equipment involved that the AC line voltage has gone below the monitored level, endangering the proper operation of the equipment after a period of time when the DC battery 21 discharges to a point where the battery is automatically disconnected from the DC to AC inverter 20 in a manner to be explained. The previously mentioned reset pushbutton switch S2 is connected to the alarm circuit 56 so that the audible alarm 58 and the flashing indication on the arm indicator light L2 can be cancelled by momentary depression of the pushbutton reset switch S2.

It is also most preferred that the operator be alerted when the charge on the battery 21 has not yet reached the point where it is close to a "deep discharge" condition. To this end, any suitable low battery voltage sensing circuit may be utilized, which could include a Signetics 555 timer chip. In any event, when this low battery condition exists, the circuit 56 energizes the flasher portion of the alarm circuit 56 to once again reestablish a flashing indication on the alarm indicator light L2, and energizes the audible alarm 58. In this case, however, it is preferred that the operation of the manual reset switch S2 be ineffective to de-energize the audible alarm 58 or the flashing of the alarm indicating unit L2, unless the enable switch S3 is moved to its "off" position, which disconnects the battery 21 from the portions of the circuit providing +24 and +12 volts for operating the various circuits described.

FIG. 2 shows a conductor 59 extending from the No. 3 "Output" terminal of the trigger circuit 56 to an opto-isolator circuit 60 which generates an alarm signal at the output terminals 9 thereof, so that a computer or other electrical device can respond thereto by giving an indication that the device is now on battery power having a limited useful time period.

When the degree of discharge of the battery 21 approaches closely a deep discharge condition which can damage the battery, there is operated a means for disconnecting the battery from the DC to AC inverter circuit 20, which terminates a rated voltage on the load device input terminal sockets 18-1, 18-2. To this end, as shown in FIG. 2, a Signetics timer chip 36' is provided. The "Trigger" No. 2 terminal of this timer chip 36' is shown connected to the juncture of the voltage divider resistor 62a and 62b. This voltage is a measure of when the battery is nearing a deep discharge condition, requiring its disconnection from the inverter circuit 20. The No. 8 terminal of this chip is shown connected to the +12 volt terminal 23. The No. 6 "Threshold" terminal thereof is connected through resistor 64 and a set of contacts S1-2 of the "Output Power" toggle switch S1 to the +12 volt terminal 23. The No. 3 "Output" terminal of this timer chip is shown connected to a relay control circuit 66 which may be the same as the relay control circuit 39, except that it controls the relay K2 connected between this control circuit and the +24 volt terminal 23. When the trigger circuit formed by the timer chip 36' is in its reset state, which occurs when the battery is not discharged to a point near its deep discharge condition, the grounded condition on the No. 3 "Output" terminal of this chip will operate the relay control circuit 66 to de-energize the relay K2. The closed (normally open) contacts K2-1 will then be opened to disconnect the battery 21 from the DC to AC inverter circuit 20. When the battery voltage drops to a point where the timer chip 36' is operated to a set condition, the presence of a positive voltage on the No. 3 "Output" terminal of this chip will operate the relay control circuit 66 to de-energize the relay K2 to disconnect the battery 21 from the inverter circuit 20. However, this chip is not automatically reset as in the case of the timer chip forming the trigger circuit 36 previously described. In order to reset the timer chip 36', it is necessary to momentarily operate the "Output Power" switch S1 to its "off" position, which will close the contacts S1-2 to effect resetting of the trigger circuit formed by the chip 36'.

While the DC to AC inverter circuit 20 and a driver circuit 20' therefor can take any one of a number of different forms, these circuits may be designed in the manner shown in FIG. 5.

When the unit 10 is in its "standby mode" of operation, as previously indicated, the inverter circuit 20 is inoperative. The invertor circuit comprises a pair of parallel connected power transistors 66 connected between a conductor 68 extending from the outer end of the transformer winding section T1b-1 and ground, and a pair of similarly connected power transistors 66' connected between a conductor 68' extending from the outer end of the transformer winding T1b-1' and ground.

The inner ends of the transformer windings T1b and T1b-1' are connected together and extend to the battery through the contacts K2-1, the coil 30, and the fuse 22. Rectifiers 74-74' are similarly connected between the conductors 68 and 68' and a parallel circuit connected to ground comprising a resistor 80 and a capacitor 78. The rectifiers 74-74' and the resistor 80 and capacitor 78 form a de-spiking circuit when the power transistor 66 and 66' are switched off.

When the relay K1 is energized, the movable poles K1-3 and K1-3' thereof are connected to the "b" and "b'" contact terminals, and the battery 21 receives its charging voltage from the voltage induced from the primary winding T1a across maximum voltage producing series connected windings T1b-2, T1b-1, T1b-1' and T1b-2'. The windings T1b-2 and T1b-2' are the feedback windings of the inverter circuit thereshown connected in a unique way described to increase the charging voltage on the battery 21. Resistors 72 and 72' connected between the feedback windings T1b-2 and T1b-2' and the collector circuits of driver transistor 84-86 and 84'-86', limit the base drive from the feedback windings T1b-2 and T1b-2'.

When the AC line voltage drops below the monitored value, and the relay K1 becomes de-energized, the movement of the movable poles K1-3 and K1-3' of the relay K-1 to the "a" and "a'" contacts, a driver circuit 20' becomes effective to drive the bases of the power transistor pairs 66 and 66', alternately to render them conductive to connect the battery 21 alternately and in series relationship with the transformer windings T1b-1 and T1b-1' during alternate half cycles of a square wave drive voltage generated by a square wave multivibrator circuit 87. At the cross-over point when the conduction between the transistor pairs 66 and 66' are to be reversed, momentarily the power transistors of both pairs can be simultaneously conducting, and the resultant distortion energy is stored by the flyback inductor 30, which enegy is subsequently returned for use by the circuit by free wheel rectifier 30' shunting the flyback inductor 30.

The drive circuit for these power transistors include transistor pairs 84-86 and 84'-86' connected in a Darlington configuration. The base of the transistors 84 and 84' are alternately driven from the output of the multivibrator circuit 87, which is formed from an integrated circuit chip IC3, which may be chip No. CD4047BE. The various terminals of this chip are shown connected in FIG. 5 to form a multivibrator circuit which can be adjusted to 60Hz by a variable potentiometer 77, and is switchable to a 50Hz frequency upon movement of a switch 74 into a position which bridges "b" and "a" contacts shown to short out a resistor 76.

When the battery 21 is operatively disconnected from the inverter circuit when it is nearing its deep discharge condition, the battery 21 can nevertheless continue to be charged by virtue of the rectifier 82 which shunts the then open relay contacts K2-1.

Figure 6:
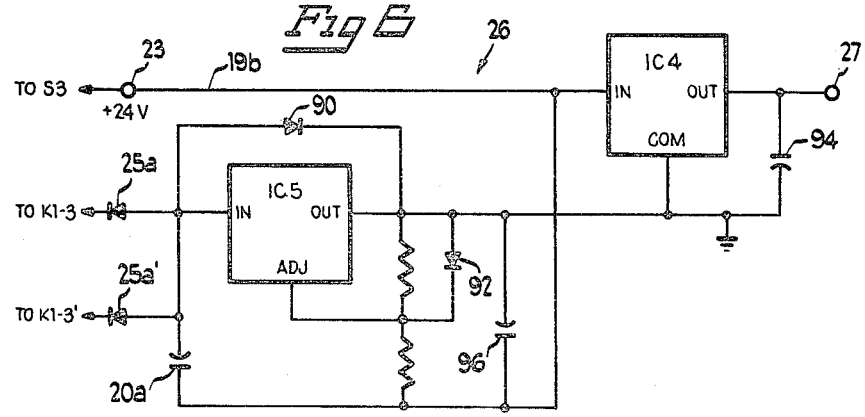
FIG. 6 shows exemplary battery charge and voltage regulator circuits shown in simplified form in FIG. 2.

FIG. 6 shows the voltage regulator circuit 26 including an integrated circuit chip IC5 (which may be Chip No. LM337T) connected as a three terminal adjustable negative voltage regulator programmed for 28.0 volt output to float charge the 24 volt battery which is connected to the circuit as shown. An integrated circuit chip IC4 (which may be Chip No. TL780-12C) is a three terminal fixed positive voltage regulator providing +12 output for logic power. The capacitors 94 and 96 shown stabilize the voltages in the portions of the circuit illustrated, and rectifiers 90 and 92 therein supply circuit protection.

It should be apparent that the present invention provides a highly reliable and relatively inexpensive and very fast reacting standby AC electrical power system which can operate to render the inverter circuit operative to supply AC power to the load when the AC line voltage drops below a monitored value, the protection being forwarded in less than one half cycle of the AC line voltage because of the unique circuitry described.

It should be understood that numerous modifications may be made in the most preferred forms of the invention described without deviating from the broader aspects thereof.

I claim:

1. In a standby AC electrical power system including load device input terminals to which the power input terminals of an electrical device to be continuously powered are to be connected, power terminal means for connecting the standby power system to a source of external AC line voltage which is normally fed to said load device input terminals to energize the electrical device, DC battery connecting terminals to which a chargeable DC battery is to be connected, and a DC to AC inverter circuit to be energized by said chargeable DC battery when the average value of said AC line voltage drops to a given low level when the inverter circuit is to supply a rated AC voltage to said load device input terminals, the improvement in a voltage responsive control circuit connected between said power terminal means and said DC to AC inverter circuit, said control circuit comprising: full wave rectifier circuit means connected to said power terminal means for providing a full wave rectified pulsating DC output from the AC line voltage; DC voltage responsive circuit means coupled to the output of said rectifier circuit means for continuously providing a modified pulsating DC control voltage which has an envelope which responds to and follows but at a different rate the increase and decrease in the envelope of said rectified pulsating DC output while remaining above a given triggering level when the average value of said rectified pulsating DC output for the current half cycle involved stays above a given level indicating that the average value of the current half cycle of the AC line voltage is above said given low level, and dropping to said triggering level when the average value of the current half cycle of said AC line voltage drops to said given low level, said DC voltage responsive circuit comprising a multi-branched capacitor charge and discharge circuit having a first relatively long time constant producing branch which provides a relatively slowly increasing envelope in response to the rise in the envelope of said rectified output and a relatively short time constant producing branch which provides a relatively rapidly decreasing envelope in response to the drop in the envelope of said rectified output; and control means including a trigger circuit responsive to the dropping of said envelope of said modified pulsating DC control voltage to said triggering level for effecting the connection of said DC battery connecting terminals to said DC to AC inverter circuit to energize the same and effecting the feeding of the AC voltage output thereof to said load device input terminals to adequately energize the same.

2. The standby AC electrical power system of claim 1 wherein said relatively short time constant producing branch of said capacitor charge and discharge circuit includes a series circuit of a first resistor means and a first rectifier connected to first capacitor means, said short time constant producing branch and first capacitor means forming a series circuit coupled between the output of said rectifier circuit and a common voltage reference point, the rectifier being back biased when the voltage charge on said capacitor is less than the voltage on the terminal of said first rectifier remote from said first capacitor means, said capacitor rapidly discharging through said first rectifier when these voltage conditions are reversed, and said trigger circuit being responsive to the voltage charge on said first capacitor means, the variation of which is said modified pulsating DC voltage.

3. The standby AC electrical power system of claim 2 wherein said relatively long time constant producing branch of said capacitor charge and discharge circuit includes a bidirectional conducting branch comprising second resistance means much larger than said first resistance means and shunting said short time constant producing branch.

4. The standby AC electrical power system of claim 2 wherein said trigger circuit includes: a bistable circuit and first means for setting said bistable circuit when the voltage charge on said first capacitor means drops to said triggering level, said voltage responsive circuit includes a bistable resetting branch comprising a series circuit of a second rectifier, second resistor means and second capacitor means forming a series circuit coupled between the output of said rectifier circuit and said common voltage reference point, said second rectifier being connected to enable said second capacitor means to be charged by the rectified pulsating DC output of said rectifier circuit, the voltage on said second capacitor means reaching a bistable resetting level when the rectified pulsating DC output of said rectifier circuit is indicative of the AC line voltage having an average value above said low level, and second means responsive to the voltage charge on said second capacitor means reaching said bistable resetting level for resetting said bistable circuit; and said control means further including means responsive to the set state of said bistable circuit for connecting said DC battery connecting terminals to said DC to AC inverter system to energize the same and responsive to the reset state thereof for disconnecting said DC battery from said DC to AC inverter circuit.

5. In a standby AC electrical power system including load device input terminals to which the power input terminals of an electrical device to be continuously powered are to be connected, power terminal means for connecting the standby power system to a source of external AC line voltage which is normally fed to said load device input terminals to energize the electrical device, DC battery connecting terminals to which a chargeable DC battery is to be connected, and a DC to AC inverter circuit to be energized by said chargeable DC battery when the average value of said AC line voltage drops to a given low level when the inverter circuit is to supply a rated AC voltage to said load device input terminals, the improvement in a voltage responsive control circuit connected between said power input terminal means and said DC to AC inverter circuit, said control circuit comprising: full wave rectifier circuit means connected to said power terminal means for providing a full wave rectified pulsating DC output from the AC line voltage; DC voltage responsive circuit means coupled to the output of said rectifier circuit for continuously providing a modified pulsating DC control voltage which has an envelope which responds to the increase and decrease in the envelope of said rectified pulsating DC output while remaining above a given triggering level when the average value of said rectified pulsating DC output for the current half cycle involved stays above a given level indicating that the average value of the current half cycle of the AC line voltage is above said given low level, and dropping to said triggering level when the average value of the current half cycle of said AC line voltage drops to said given low level; and control means including a trigger circuit responsive to the dropping of said envelope of said modified pulsating DC control voltage to said triggering level for effecting the connection of said DC battery connecting terminals to said DC to AC inverter circuit to energize the same and effecting the feeding of the AC voltage output thereof to said load device input terminals to adequately energize the same.

6. The standby electrical power system of claim 5 wherein said modified pulsating DC output has a relatively slowly increasing envelope in response to the rise in the envelope of said rectified output and a relatively rapidly decreasing envelope in response to the drop in the envelope of said rectified output.

7. The standby electrical power system of claim 5 wherein said trigger circuit includes: a bistable circuit and first means for setting said bistable circuit when the control voltage drops to said triggering level; said voltage responsive circuit includes a bistable resetting branch comprising a series circuit of a rectifier, resistor means and capacitor means forming a series circuit coupled to the output of said rectifier circuit, the voltage on said capacitor means reaching a bistable resetting level when the rectified pulsating DC output of said rectifier circuit is indicative of the AC line voltage having an average value above said low level, and second means responsive to the voltage charge on said capacitor means reaching said bistable resetting level for resetting said bistable circuit; and said control means further including means responsive to the set state of said bistable circuit for connecting said DC battery connecting terminals to said DC to AC inverter system to energize the same and responsive to the reset state thereof for disconnecting said DC battery from said DC to AC inverter circuit.

8. The standby AC electrical power system of claim 7 wherein said first means is a comparator circuit which compares a reference voltage with the voltage charge on said first capacitor means.

9. The standby AC electrical power system of claim 7 wherein said second means is a comparator circuit which compares a reference voltage with the voltage charge on said second capacitor means.

10. The standby AC electrical power system of claim 7 wherein there is provided means for keeping said capacitor means discharged when said bistable circuit is reset and permitting said second capacitor means to charge while said bistable circuit is set.

11. The standby AC electrical power system of claim 10 wherein the time constant of the charge circuit of said capacitor means encompasses a large number of cycles of said AC line voltage, so that the charge on said capacitor means cannot reach said bistable resetting level until the AC line voltage appears to have stabilized at a normal value.

* * * * *